(12) United States Patent
Fung

(10) Patent No.: US 9,425,042 B2
(45) Date of Patent: Aug. 23, 2016

(54) HYBRID SILICON GERMANIUM SUBSTRATE FOR DEVICE FABRICATION

(71) Applicant: Taiwan Semiconductor Manufacturing Company Limited, Hsinchu (TW)

(72) Inventor: Ka-Hing Fung, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 141 days.

(21) Appl. No.: 14/050,495

(22) Filed: Oct. 10, 2013

(65) Prior Publication Data
US 2015/0102385 A1    Apr. 16, 2015

(51) Int. Cl.
| | |
|---|---|
| H01L 29/76 | (2006.01) |
| H01L 21/02 | (2006.01) |
| H01L 21/8238 | (2006.01) |
| H01L 21/28 | (2006.01) |
| H01L 29/10 | (2006.01) |
| H01L 27/092 | (2006.01) |

(52) U.S. Cl.
CPC .... *H01L 21/02381* (2013.01); *H01L 21/28255* (2013.01); *H01L 21/823807* (2013.01); *H01L 21/823821* (2013.01); *H01L 29/1054* (2013.01); H01L 21/0245 (2013.01); H01L 21/02532 (2013.01); H01L 27/0924 (2013.01)

(58) Field of Classification Search
CPC ............ H01L 27/0924; H01L 29/7855; H01L 29/7856

USPC .......................................................... 257/372
See application file for complete search history.

(56) References Cited

U.S. PATENT DOCUMENTS

| | | | |
|---|---|---|---|
| 7,045,401 B2 | 5/2006 | Lee et al. | |
| 7,326,634 B2 | 2/2008 | Lindert et al. | |
| 7,384,829 B2* | 6/2008 | Cheng ............ | H01L 21/823412 257/E21.618 |
| 7,767,560 B2 | 8/2010 | Jin et al. | |
| 7,993,999 B2 | 8/2011 | Basker et al. | |
| 8,053,299 B2 | 11/2011 | Xu | |
| 8,283,653 B2 | 10/2012 | Pillarisety et al. | |
| 2007/0221956 A1* | 9/2007 | Inaba ............................. 257/197 | |
| 2014/0008730 A1* | 1/2014 | Mitard et al. .................. 257/369 | |
| 2014/0097518 A1* | 4/2014 | Cheng et al. .................. 257/618 | |
| 2014/0367741 A1* | 12/2014 | Yang ........................ | H01L 29/04 257/190 |

* cited by examiner

*Primary Examiner* — Chandra Chaudhari
(74) *Attorney, Agent, or Firm* — Jones Day

(57) ABSTRACT

Systems and methods are provided for fabricating a semiconductor device structure. An example semiconductor device structure includes a first buffer layer, a second buffer layer, a n-type transistor structure, and a p-type transistor structure. The first buffer layer having a first germanium concentration is formed on a substrate. The second buffer layer having a second germanium concentration is formed on the substrate, the second germanium concentration being larger than the first germanium concentration. The n-type transistor structure is formed on the first buffer layer, and the p-type transistor structure is formed on the second buffer layer.

19 Claims, 6 Drawing Sheets

US 9,425,042 B2

HYBRID SILICON GERMANIUM SUBSTRATE FOR DEVICE FABRICATION

FIELD

The technology described in this disclosure relates generally to electronic devices and more particularly to semiconductor device structures.

BACKGROUND

Carrier mobility of a transistor is often increased when a strain is applied to the channel of the transistor. For example, in a p-type transistor, the application of a compressive longitudinal strain to the channel usually increases the drive current of the p-type transistor. Silicon germanium is a desirable lattice-mismatched semiconductor for use in forming strained channels in silicon-based p-type transistors, because silicon germanium has a larger lattice constant than silicon and a compressive strain is often created in silicon germanium when silicon germanium grows epitaxially on silicon. However, if the germanium concentration in a silicon germanium channel on silicon exceeds a certain threshold (e.g., 30%), a relaxed graded buffer is often needed to reduce defects in the silicon germanium channel caused by the lattice mismatch between silicon germanium and silicon.

SUMMARY

In accordance with the teachings described herein, systems and methods are provided for fabricating a semiconductor device structure. An example semiconductor device structure includes a first buffer layer, a second buffer layer, a n-type transistor structure, and a p-type transistor structure. The first buffer layer having a first germanium concentration is formed on a substrate. The second buffer layer having a second germanium concentration is formed on the substrate, the second germanium concentration being larger than the first germanium concentration. The n-type transistor structure is formed on the first buffer layer, and the p-type transistor structure is formed on the second buffer layer.

In one embodiment, a method is provided for fabricating a semiconductor device structure. A first buffer layer having a first germanium concentration is formed on a substrate. A second buffer layer having a second germanium concentration is formed on the substrate, the second germanium concentration being larger than the first germanium concentration. A n-type transistor structure is formed on the first buffer layer, and a p-type transistor structure is formed on the second buffer layer.

DETAILED DESCRIPTION

Figure 1:
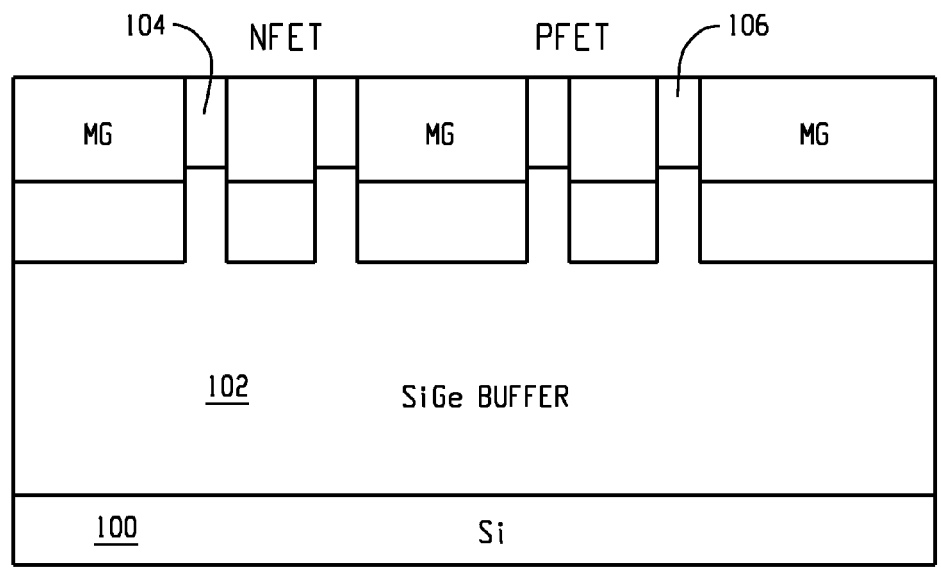
FIG. 1 depicts an example diagram of a substrate with a single buffer layer.

FIG. 1 depicts an example diagram of a substrate with a single buffer layer. As shown in FIG. 1, the substrate 100 with the germanium-containing buffer 102 is used for fabricating both n-type transistors and p-type transistors. However, the germanium concentration in the buffer 102 may not be optimal for both the n-type transistors and the p-type transistors. For example, a n-type transistor usually has a silicon channel (e.g., the channel 104) because the electron mobility of silicon is much higher than that of germanium-containing materials. Thus, the germanium concentration in the buffer 102 cannot be very high, because otherwise a large amount of defects may be generated in the silicon channel due to the lattice mismatch between the buffer 102 and the channel. On the other hand, a p-type transistor that has a germanium-containing channel (e.g., the channel 106) usually demands a high germanium concentration in the buffer 102 for high hole mobility. Therefore, it is difficult to achieve an optimal germanium concentration in a single germanium-containing buffer for fabricating both n-type transistors and p-type transistors.

Figure 2:
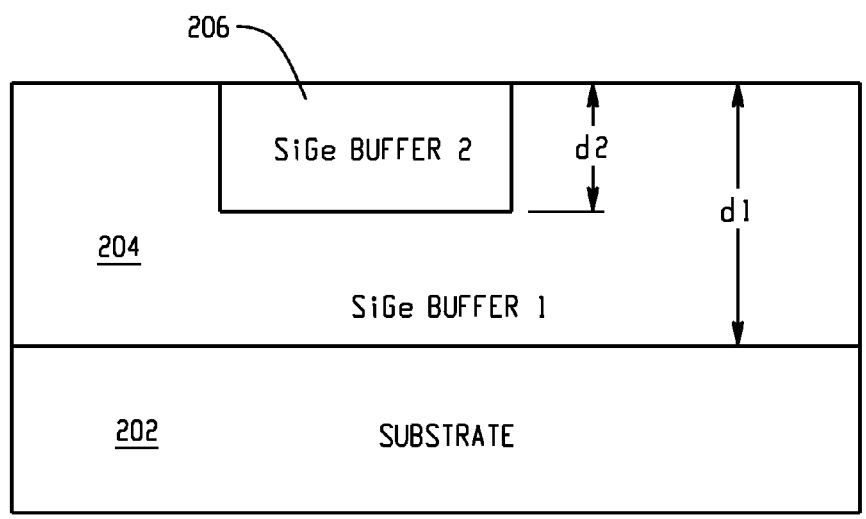
FIG. 2 depicts an example diagram showing a substrate including two buffer layers.

FIG. 2 depicts an example diagram showing a substrate including two buffer layers. As shown in FIG. 2, the germanium-containing buffer layer 204 is formed on the substrate 202, and another germanium-containing buffer layer 206 is formed in a recessed region of the buffer layer 204. The buffer layer 206 that has a higher germanium concentration than the buffer layer 204 is used for fabricating p-type transistors, and the buffer layer 204 is used for fabricating n-type transistors. In an embodiment, the buffer layer 206 extends above the recessed region of the buffer layer 204. In another embodiment, the buffer layer 206 is formed entirely on top of the buffer layer 204. In yet another embodiment, the buffer layer 206 is formed directly on the substrate 202.

For example, the germanium concentration of the buffer layer 204 is selected in a range of about 15% to about 30%, and the germanium concentration of the buffer layer 206 is selected in a range of about 30% to about 70%. The buffer layers 204 and 206 include silicon germanium and each have a graded germanium concentration or a constant germanium concentration. In some embodiments, the thickness of the buffer layer 204 (e.g., d1) is selected in a range of about 200 nm to about 500 nm, and the thickness of the buffer layer 206 (e.g., d2) is selected in a range of about 100 nm to about 400 nm. As an example, a ratio between the thickness of the buffer layer 204 and the thickness of the buffer layer 206 is selected in a range of about 0.2 to about 0.8. The substrate 202 includes silicon, silicon germanium, germanium, gallium arsenide, indium antimonide, gallium phosphide, gallium antimonide, or other suitable materials.

Figure 3A:
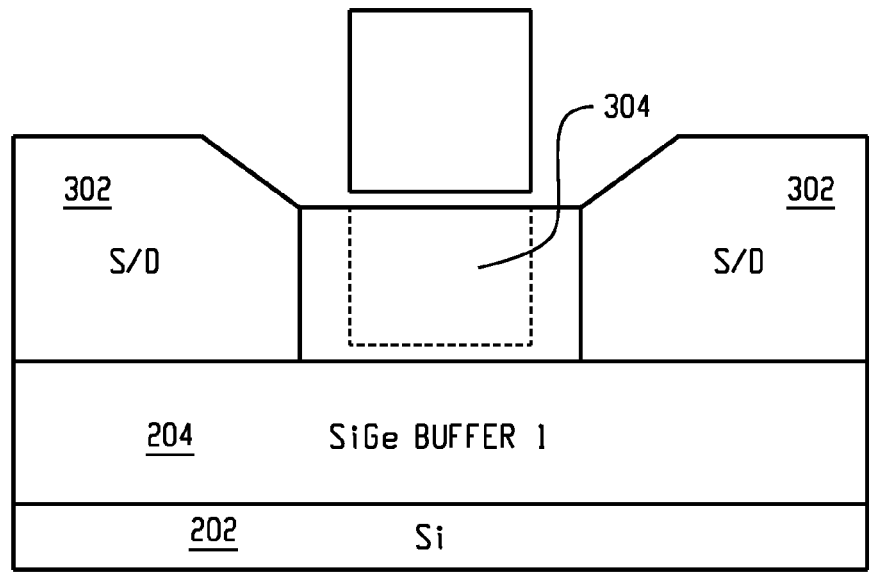
FIG. 3(a) and FIG. 3(b) depict example diagrams showing a n-type transistor and a p-type transistor fabricated on a substrate with two buffer layers.
Figure 3B:
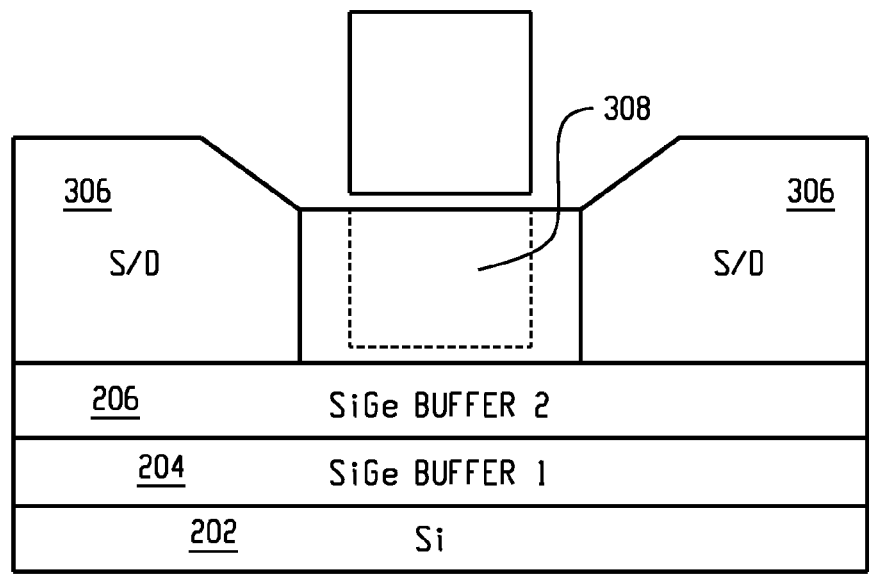

FIG. 3(a) and FIG. 3(b) depict example diagrams showing a n-type transistor and a p-type transistor fabricated on the substrate 202 with two buffer layers 204 and 206. As shown in FIG. 3(a), the n-type transistor that includes source/drain regions 302 and a channel 304 is formed on the germanium-containing buffer layer 204. As shown in FIG. 3(b), the p-type transistor that includes source/drain regions 306 and a channel 308 is formed on the germanium containing buffer layer 206. For example, the channel 304 includes silicon, and the channel 308 includes silicon germanium that has a germanium concentration higher than that of the buffer layer 206.

Figure 4:
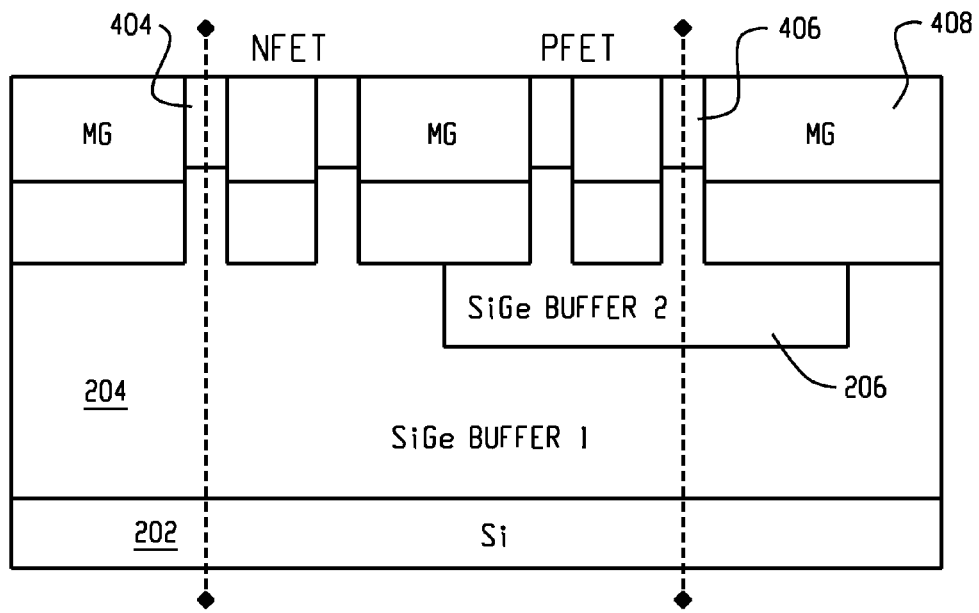
FIG. 4 depicts another example diagram showing n-type transistors and p-type transistors fabricated on a substrate with two buffer layers.

FIG. 4 depicts another example diagram showing n-type transistors and p-type transistors fabricated on the substrate 202 with two buffer layers 204 and 206. As shown in FIG. 4, the n-type transistors and the p-type transistors are fabricated on the buffer layers 206 and 204 respectively. Channels of the n-type transistors (e.g., the channel 404) and channels of the p-type transistors (e.g., the channel 406) are formed using fin structures. Gate electrodes (e.g., the gate electrode 408) are formed adjacent to the channels. For example, the gate electrodes include polysilicon, one or more metal materials, or other suitable materials.

Figure 5:
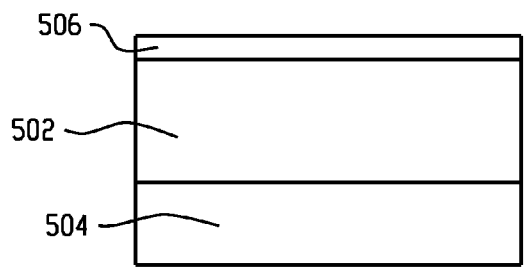
FIGS. 5-11 depict example diagrams showing a process flow for fabricating transistors on a substrate including two buffer layers

FIGS. 5-11 depict example diagrams showing a process flow for fabricating transistors on a substrate including two buffer layers. As shown in FIG. 5, a substrate 504 is provided. For example, the substrate 504 is a silicon substrate (e.g., with a crystal orientation of <100>). A germanium-containing buffer layer 502 (e.g., silicon germanium) is formed on a substrate 504. A hardmask 506 is formed on the buffer layer 502 for further processing. For example, the hardmask 506 includes oxide, silicon nitride, or other suitable materials.

Figure 6:
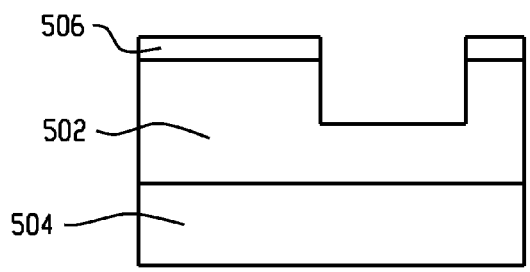
Figure 7:
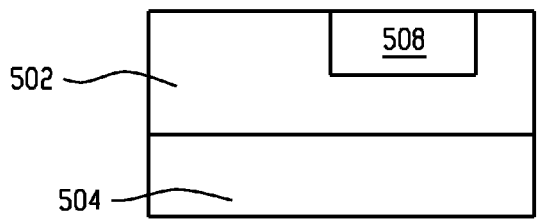

A photolithography process is carried out, and a recessed region is created (e.g., through etching) in the buffer layer 502, as shown in FIG. 6. Then, a germanium-containing material (e.g., silicon germanium) is deposited into the recessed region until the recessed region is fully filled. A chemical-mechanical polishing/planarization (CMP) process is performed to remove the hardmask and the deposited germanium-containing material above the recessed region. Another germanium-containing buffer layer 508 is formed, as shown in FIG. 7. For example, the buffer layer 502 is the same as the buffer layer 204, and the buffer layer 508 is the same as the buffer layer 206.

Figure 8:
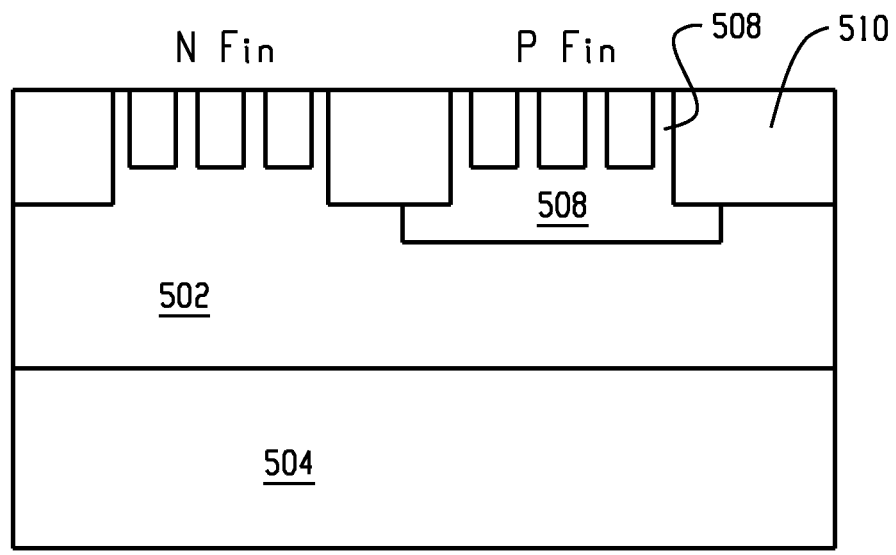

A Fin-field-effect-transistor/tri-gate shallow-trench-isolation (STI) process is carried out. For example, multiple fins (e.g., the fin 508) are fabricated in the buffer layer 502 and the buffer layer 508 through photolithography and etching (e.g., dry etching or wet etching). Shallow-trench-isolation (STI) structures (e.g., the structure 510), such as STI liners and STI oxides, are fabricated adjacent to the fins. A CMP process is carried out to obtain a structure as shown in FIG. 8.

Figure 9:
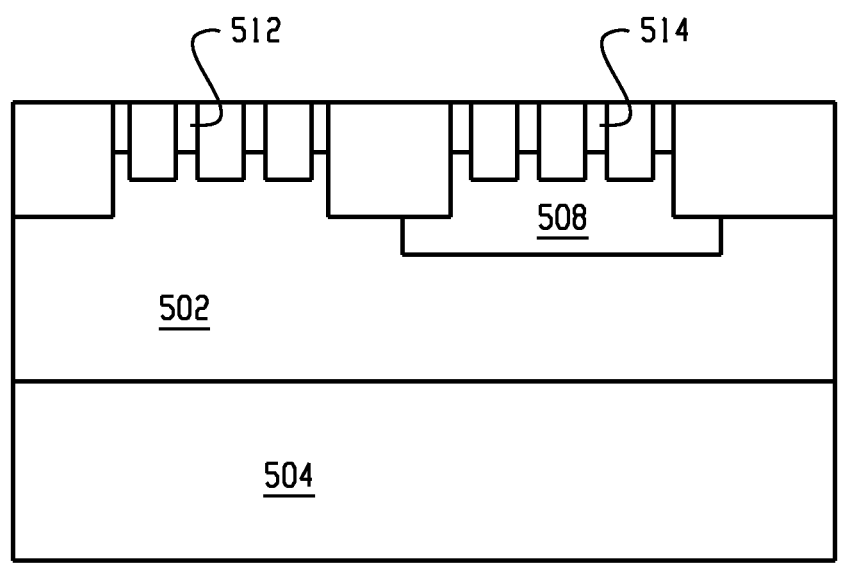
Figure 10:
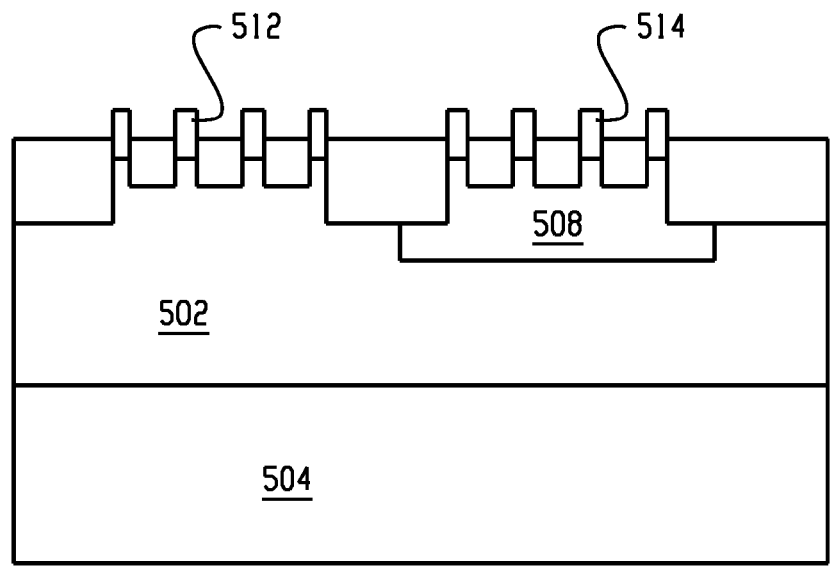

The fins in the buffer layer 502 and the buffer layer 508 are then replaced with different materials for fabricating n-type transistors and p-type transistors respectively, as shown in FIG. 9. For example, the replacement fins (e.g., the fin 512) for fabricating n-type transistors include silicon. The replacement fins (e.g., the fin 514) for fabricating p-type transistors include germanium-containing materials and have a higher germanium concentration than that of the buffer layer 508. The fin structures as shown in FIG. 10 are formed by removing a certain amount of the STI structures.

Figure 11:
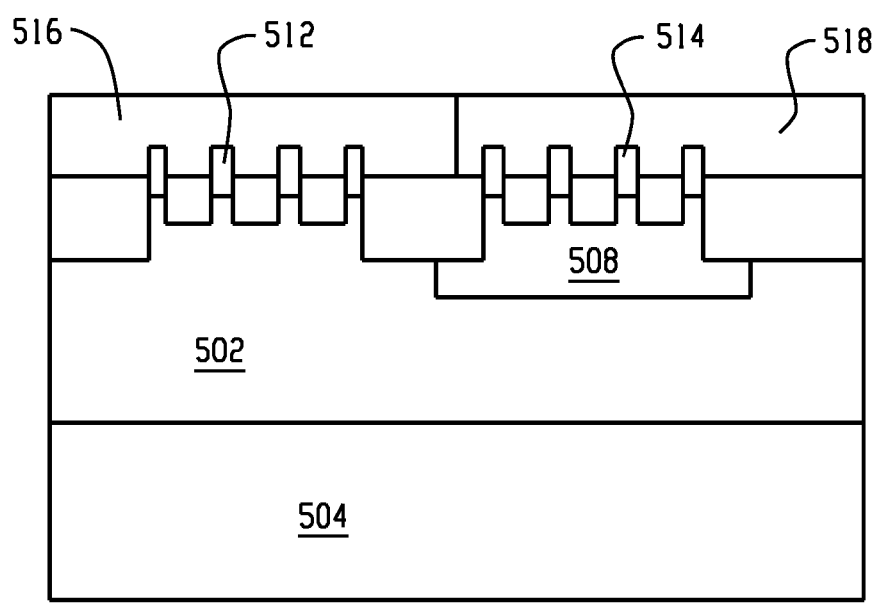

A high-k-metal-gate process is performed. For example, an interfacial layer (e.g., oxides) and a gate dielectric layer (e.g., high-k dielectric) are formed on the fin structures. Then, gate electrodes are formed on the fin structures, as shown in FIG. 11. As an example, the gate electrodes include one or more metal materials, polysilicon, or other suitable materials. The gate electrodes (e.g., the gate electrode 516) for n-type transistors may include different materials than the gate electrodes (e.g., the gate electrode 518) for p-type transistors because work functions of the gate electrodes need to be tailored for different types of devices. The gate dielectric layer (not shown in FIG. 11) includes hafnium oxide, zirconium oxide, tantalum oxide, titanium oxide, silicon oxide, silicon oxynitride, or other suitable materials.

Figure 12:
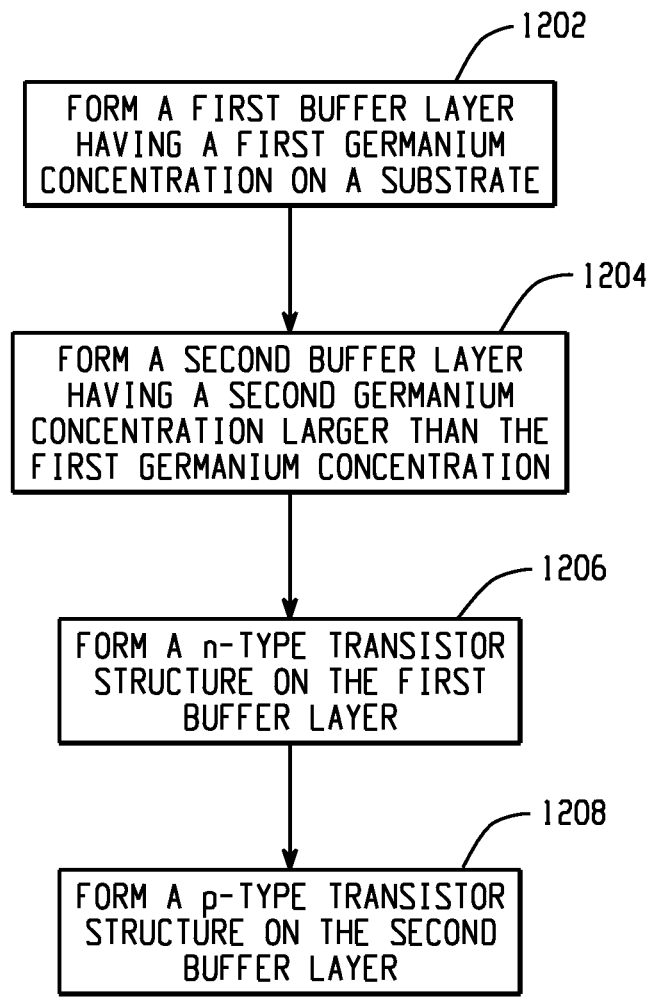
FIG. 12 depicts an example flow chart for fabricating a semiconductor device structure.

FIG. 12 depicts an example flow chart for fabricating a semiconductor device structure. At 1202, a first buffer layer having a first germanium concentration is formed on a substrate. At 1204, a second buffer layer having a second germanium concentration is formed on the substrate. The second germanium concentration is larger than the first germanium concentration. For example, the first germanium concentration is selected in a range of about 15% to about 30%, and the second germanium concentration is selected in a range of about 30% to about 70%. At 1206, a n-type transistor structure is formed on the first buffer layer. At 1208, a p-type transistor structure is formed on the second buffer layer.

In some embodiments, the second buffer layer is formed in a recessed region in the first buffer layer. For example, the second buffer layer extends above the recessed region. In certain embodiments, the second buffer layer is formed entirely on top of the first buffer layer. As an example, the thickness of the first buffer layer is selected in a range of about 200 nm to about 500 nm, and the thickness of the second buffer layer is selected in a range of about 100 nm to about 400 nm. A ratio between the thickness of the first buffer layer and the thickness of the second buffer layer is selected in a range of about 0.2 to about 0.8.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures. For example, certain transistors are described herein as examples, and the concepts, structures, layouts, materials, or operations may also be applicable to other types of semiconductor devices, such as bipolar junction transistors, diodes, capacitors, etc. As an example, the structures, layouts, materials, operations, voltage levels, or current levels related to "source" and "drain" described herein (including in the claims) may be interchangeable as a result of transistors with "source" and "drain" being symmetrical devices.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as top, on, etc. that are used for descriptive purposes only and are not to be construed as limiting. The embodiments of a device or article described herein can be manufactured, used, or shipped in a number of positions and orientations. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not necessarily indicate that a first layer/structure "on" a second layer/structure is directly on or over and in immediate contact with the second layer/structure unless such is specifically stated; there may be one or more third layers/structures between the first layer/structure and the second layer/structure. The term "in" used herein (including in the claims) for a situation where a device/component is fabricated "in" a layer/structure does not indicate that all parts of the device/component are completely contained inside the layer/structure unless such is specifically stated; there may be one or more parts of the device/component exist outside of the layer/structure. The term "substrate" used herein (including in the claims) may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The term "semiconductor device structure" used herein (including in the claims) may refer to shallow trench isolation features, poly-silicon gates, lightly doped drain regions, doped wells, contacts, vias, metal lines, or other types of circuit patterns or features to be formed on a semiconductor substrate.

What is claimed is:

1. A semiconductor device structure, comprising:
   a substrate;
   a first buffer layer having a first germanium concentration formed on the substrate and formed with a recessed region thereinto;
   a second buffer layer having a second germanium concentration formed in the recessed region in the first buffer laver, the second germanium concentration being larger than the first germanium concentration;
   a n-type transistor structure formed on the first buffer layer; and
   a p-type transistor structure formed on the second buffer layer.

2. The semiconductor device structure of claim 1, wherein:
   the first germanium concentration is in a range of about 15% to about 30%; and
   the second germanium concentration is in a range of about 30% to about 70%.

3. The semiconductor device structure of claim 1, wherein:
   the first buffer layer is associated with a first thickness; and
   the second buffer layer is associated with a second thickness smaller than the first thickness.

4. The semiconductor device structure of claim 3, wherein a ratio between the first thickness and the second thickness is in a range of about 0.2 to about 0.8.

5. The semiconductor device structure of claim 3, wherein:
   the first thickness is in a range of about 200 nm to about 500 nm;
   the second thickness is in a range of about 100 nm to about 400 nm.

6. The semiconductor device structure of claim 1, wherein the first germanium concentration is graded or constant.

7. The semiconductor device structure of claim 1, wherein the second germanium concentration is graded or constant.

8. The semiconductor device structure of claim 1, wherein the first buffer layer includes silicon germanium.

9. The semiconductor device structure of claim 1, wherein the second buffer layer includes silicon germanium.

10. The semiconductor device structure of claim 1, wherein the n-type transistor structure includes a silicon channel.

11. The semiconductor device structure of claim 1, wherein the p-type transistor structure includes a germanium-containing channel having a third germanium concentration larger than the second germanium concentration.

12. The semiconductor device structure of claim 1, wherein the n-type transistor structure and the p-type transistor structure each include a fin structure.

13. A semiconductor device structure comprising:
    a substrate having a surface;
    a pair of transistors spaced apart from each other in a horizontal direction substantially parallel to the surface of the substrate; and
    a pair of buffer layers, each of which is formed between the substrate and a respective one of the transistors, and each of which includes a buffer layer material, wherein the buffer layer materials include the same matter but in different concentrations, wherein one of the buffer layers is formed thereinto with a recessed region in which the other of the buffer layers is formed.

14. The semiconductor device structure of claim 13, wherein each of the buffer layer materials is germanium.

15. The semiconductor device structure of claim 13, wherein each of the buffer layers has a distinct thickness.

16. The semiconductor device structure of claim 13, wherein each of the buffer layers has a top surface and the top surfaces lie in a same horizontal plane substantially parallel to the surface of the substrate.

17. The semiconductor device structure of claim 13, further comprising a pair of fins respectively associated with the buffer layers and having different materials.

18. The semiconductor device structure of claim 17, wherein one of the fins has a germanium concentration higher than that of the associated buffer layer.

19. The semiconductor device structure of claim 17, wherein each of the transistors includes a dielectric layer and a gate electrode that are disposed on the fin.

* * * * *